United States Patent
Chien et al.

(10) Patent No.: US 9,548,423 B2
(45) Date of Patent: Jan. 17, 2017

(54) LIGHT-EMITTING DEVICE

(71) Applicant: EPISTAR CORPORATION, Hsinchu (TW)

(72) Inventors: Jan Way Chien, Hsinchu (TW); Tzchiang Yu, Hsinchu (TW); Hsiao Yu Lin, Hsinchu (TW); Chyi Yang Sheu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/555,746

(22) Filed: Nov. 28, 2014

(65) Prior Publication Data
US 2015/0155442 A1 Jun. 4, 2015

(30) Foreign Application Priority Data
Nov. 29, 2013 (TW) .............................. 102144302 A

(51) Int. Cl.
| | |
|---|---|
| *H01L 29/22* | (2006.01) |
| *H01L 33/40* | (2010.01) |
| *H01L 33/38* | (2010.01) |
| *H01L 33/22* | (2010.01) |
| *H01L 33/44* | (2010.01) |

(52) U.S. Cl.
CPC ........... *H01L 33/405* (2013.01); *H01L 33/387* (2013.01); *H01L 33/22* (2013.01); *H01L 33/44* (2013.01)

(58) Field of Classification Search
CPC ............................... H01L 33/38; H01L 33/405
USPC ..................................................... 257/95, 98
See application file for complete search history.

(56) References Cited

U.S. PATENT DOCUMENTS

| | | | | |
|---|---|---|---|---|
| 8,004,006 | B2 * | 8/2011 | Nakahara et al. | 257/99 |
| 8,362,514 | B2 | 1/2013 | Hwang | |
| 2010/0163894 | A1 * | 7/2010 | Uemura | H01L 33/40 257/95 |
| 2011/0198664 | A1 | 8/2011 | Kang | |
| 2011/0284896 | A1 * | 11/2011 | Park | 257/98 |
| 2012/0018765 | A1 * | 1/2012 | Mizogami et al. | 257/99 |
| 2013/0153950 | A1 * | 6/2013 | Mizutani | H01L 33/40 257/99 |

* cited by examiner

*Primary Examiner* — Hung Vu
(74) *Attorney, Agent, or Firm* — Patterson + Sheridan, LLP

(57) ABSTRACT

A light-emitting device is disclosed that includes a light-emitting stack comprising a first surface; a patterned dielectric layer formed on the first surface, comprising a first portion and a second portion substantially surrounding the first portion and having substantially the same thickness with that of the first portion; a first reflective electrode covering the first portion of the patterned dielectric layer; and a barrier layer covering the first reflective electrode and the second portion of the patterned dielectric layer.

20 Claims, 4 Drawing Sheets

LIGHT-EMITTING DEVICE

REFERENCE TO RELATED APPLICATION

This application claims the right of priority based on TW application Ser. No. 102144302, filed on Nov. 29, 2013, and the content of which is hereby incorporated by reference in its entirety.

TECHNICAL FIELD

The application relates to a light-emitting device, and more particularly, to a light-emitting device having light-emitting stack located on a conductive substrate.

DESCRIPTION OF BACKGROUND ART

The lighting theory of light-emitting diodes (LEDs) is that electrons and holes between an n-type semiconductor and a p-type semiconductor are combined in the active layer to release energy. Due to the difference of lighting theories between LEDs and incandescent lamps, the LED is called "cold light source". An LED has the advantages of good environment tolerance, a long service life, portability, and low power consumption so it is regarded as another option for the lighting application. LEDs are widely adopted in different fields, for example, traffic lights, backlight modules, street lights, and medical devices and replaces conventional light sources gradually.

An LED has a light-emitting stack which is epitaxially grown on a conductive substrate or an insulative substrate. The so-called "vertical LED" has a conductive substrate and includes an electrode formed on the top of a light emitting layer; the so-called "lateral LED" has an insulative substrate and includes electrodes formed on two semiconductor layers which have different polarities and exposed by an etching process. The vertical LED has the advantages of small light-shading area for electrodes, good heat dissipating efficiency, and no additional etching epitaxial process, but has a shortage that the conductive substrate served as an epitaxial substrate absorbs light easily and is adverse to the light efficiency of the LED. The lateral LED has the advantage of radiating light in all directions due to a transparent substrate used as the insulative substrate, but has shortages of poor heat dissipation, larger light-shading area for electrodes, and smaller light-emitting area caused by epitaxial etching process. The abovementioned LED can further connects to/with other components for forming a light-emitting device. For a light-emitting device, the LED can connect to a sub-carrier by the substrate side or by soldering material/adhesive material between the sub-carrier and the LED. Besides, the sub-carrier can further comprise a circuit electrically connected to electrodes of the LED via a conductive structure, for example, a metal wire.

SUMMARY OF THE APPLICATION

A light-emitting device comprises: a light-emitting stack comprising a first surface; a patterned dielectric layer formed on the first surface, comprising a first portion and a second portion substantially surrounding the first portion and having substantially the same thickness with that of the first portion; a first reflective electrode covering the first portion of the patterned dielectric layer; and a barrier layer covering the first reflective electrode and the second portion of the patterned dielectric layer.

DETAILED DESCRIPTION OF PREFERRED EMBODIMENTS

Figure 1:
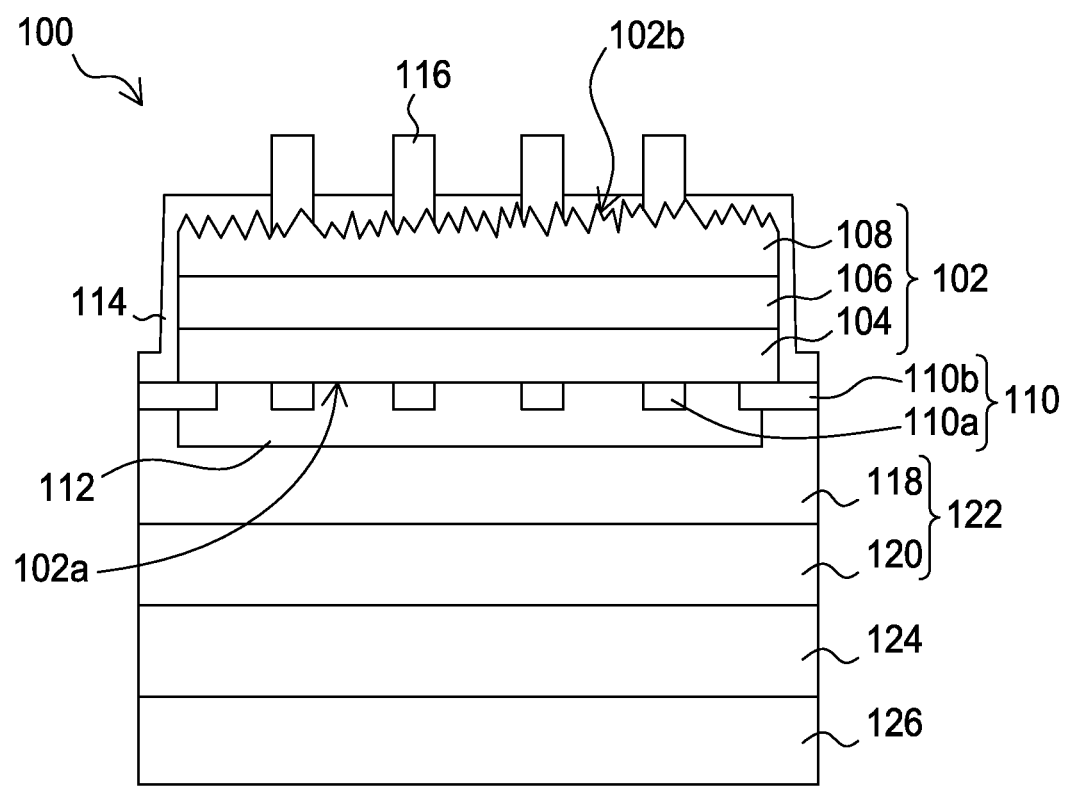
FIG. 1 illustrates a light-emitting device in accordance with a first embodiment of the present application.

FIG. 1 illustrates a light-emitting device in accordance with a first embodiment of the present application. Light-emitting device 100 comprises: a permanent substrate 126; a lighting stack 102 formed on the permanent substrate 126 and comprising a first surface 102a toward the permanent substrate 126 and a second surface 102b opposite to the first surface 102a; a patterned dielectric layer 110 formed on the first surface 102a and comprising a first portion 110a and a second portion 110b approximately surrounding the first surface 102a, wherein the first portion 110a comprises a first thickness and the second portion 110b comprises a second thickness the same as the first thickness; a first reflective electrode 112 having reflectivity and covering the first portion 110a of the patterned dielectric layer 110, wherein the material of the first reflective electrode 112 can comprise Ag, Al, or other metal having high reflectivity, or the sequence or alloy of aforesaid metal; and a barrier layer 122 covering the first reflective electrode 112 and the second portion 110b of the patterned dielectric layer 110. The second surface 102b of the light-emitting stack 102 can comprise a second electrode structure 116 comprising a pattern corresponding to that of the first portion 110a of the patterned dielectric layer 110. The first reflective electrode 112 ohmically contacts to the first surface 102a of the light-emitting surface 102, and the second electrode structure 116 ohmically contact to the second surface 102b of the light-emitting stack 102, and contact areas of the second electrode structure 116 and the first reflective electrode 112 do not overlap with each other in a vertical direction. A cross-sectional width of the barrier layer 122 can be slightly wider than the light-emitting stack 102, and the outer edge of the second portion 110b of the patterned dielectric layer 110 can approximately align with a side wall of the barrier layer 122 and project from a side wall of the light-emitting stack 102. A passivation layer 114 can cover a part of the second surface 102b of the light-emitting stack 102 that is not covered by the second electrode structure 116 by conforming to the shape of the light-emitting stack 102 and further cover a side wall of the light-emitting stack 102. The bottom of the passivation layer 114 contacts with the second portion 110b of the patterned dielectric layer 110. The material of the patterned dielectric layer 110 can comprise insulative oxide such as $TiO_2$ or $SiO_2$, insulative nitride such as $SiN_x$ or AlN, or other insulative material like $MgF_2$. The material of the passivation layer 114 can comprise $SiN_x$ or $SiO_2$. The material of the patterned dielectric layer 110 can be different from that of the passivation layer 114. In the embodiment, the material of the patterned dielectric layer 110 can comprise $TiO_2$, and material of the passivation layer 114 can comprise $SiO_2$ or silicon nitride ($SiN_x$ or $Si_3N_4$). Without the second portion 110b of the patterned dielectric layer 110, the barrier layer 122 would directly contact the bottom of the passivation layer 114 and a portion of the first surface 102a. Since the material of the barrier layer 122 is usually metal, the adhesion with the passivation layer 114 is usually poor and a gap may be formed between the bottom of the passivation 114 and the barrier layer 122. In that case, the humidity or other outside disturbance may further affect the adhesion between the barrier layer 122 and the first surface 102a via the gap between the passivation 114 and the barrier layer 122. Once the barrier layer 122 is peeled off from the first surface 102a, the first reflective electrode 112 may be overflowed from the side wall of the light-emitting stack 102, and the risk of electric anomaly or function failure of the light-emitting device 100 is increased. In the embodiment, the first reflective electrode 112 further covers partial second portion 110b of the patterned dielectric layer 110 so the barrier layer 122 is not to be in contact with the first surface 102a.

The light-emitting stack 102 is grown from a wafer-level growth substrate (not shown) in advance, and after the patterned dielectric layer 110, the first reflective electrode 112, and the barrier layer 122 are formed, the first portion 110a and the second portion 110b of the patterned dielectric layer 110 are formed at the same time during fabrication process, therefore the material and thickness of the first portion 110a are the same with that of the second portion 110b. The permanent substrate 126 can attach to the light-emitting stack 102 by a connection layer 124, the barrier layer 122 can be between the connection layer 124 and the first reflective electrode 112, and the connection layer 124 can be between the barrier layer 122 and the permanent substrate 126. The growth substrate can be removed after the permanent substrate 126 is attached to the light-emitting stack 102, and the second surface 102b can be a rough surface by using a method like dry etching. A plurality of light-emitting device 100 can be achieved by etching the light-emitting stack 102 to form trenches to form a plurality of units insulated from each other, and cutting the wafer along the trenches. The outer part of the second portion 110b is thinned when the wafer is cut, and the second portion 110b approximately remains the second thickness on a section contacts the first surface 102a.

The light-emitting stack 102 can comprise a first semiconductor layer 104, a second semiconductor layer 108, and an active layer 106 formed between the first semiconductor layer 104 and the second semiconductor layer 108, wherein the first semiconductor layer 104 can be p-type and comprises the first surface 102a, and the second semiconductor layer 108 can be n-type and comprises the second surface 102b. The barrier layer 122 can comprise a double layer structure comprising a first barrier layer 118 and a second barrier layer 120, and the material thereof can comprise Ti, W, Pt, TiW or the combination thereof. The light-emitting stack 102 can comprise single heterostructure (SH), double heterostructure (DH), double-side double heterostructure (DDH) or multi-quantum well (MQW) structure. The light-emitting stack 102 can be a nitride based light-emitting stack, and the material of the light-emitting stack 102 comprises one or more elements selected from the group consisting of Al, In, Ga, P, As, and N.

Figure 2:
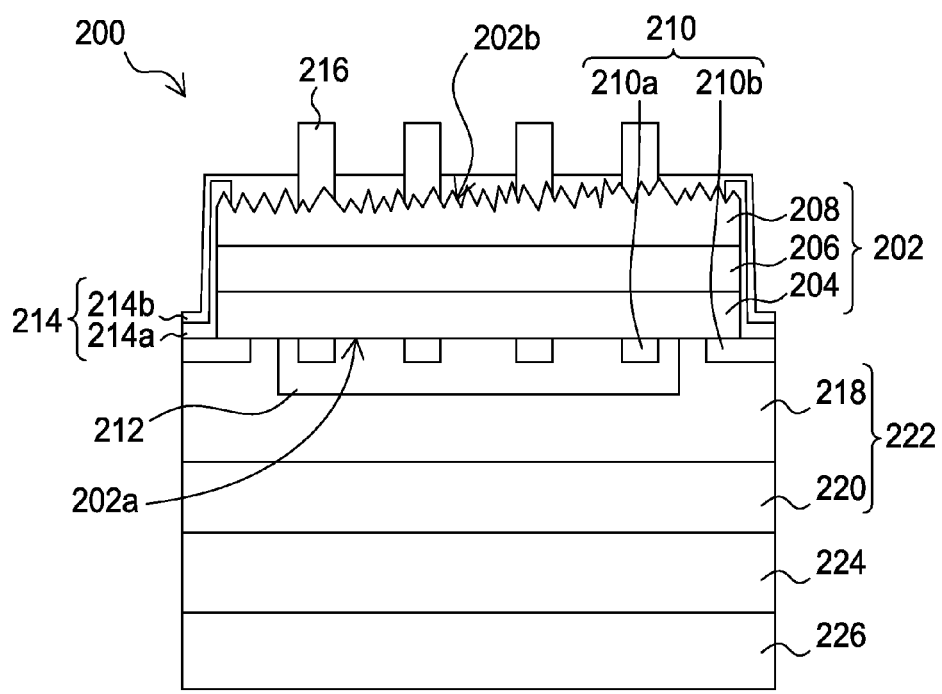
FIG. 2 illustrates a light-emitting device in accordance with a second embodiment of the present application.

FIG. 2 illustrates a light-emitting device in accordance with a second embodiment of the present application. A light-emitting device 200 comprises: a permanent substrate 226; a lighting stack 202 formed on the permanent substrate 226 and comprising a first surface 202a toward the permanent substrate 226 and a second surface 202b opposite to the first surface 202a; a patterned dielectric layer 210 formed on the first surface 202a and comprising a first portion 210a and a second portion 210b approximately surrounding the first surface 202a, wherein the first portion 210a comprises a first thickness and the second portion 210b comprises a second thickness the same as the first thickness; a first reflective electrode 212 having reflectivity and covering the first portion 210a of the patterned dielectric layer 210, wherein the material of the first reflective electrode 212 can comprise Ag, Al or other metal having high reflectivity, or the sequence or alloy of aforesaid metal; and a barrier layer 222 covering the first reflective electrode 212 and the second portion 210b of the patterned dielectric layer 210. The second surface 202b of the light-emitting stack 202 can comprise a second electrode structure 216 comprising a pattern corresponding to that of the first portion 210a of the patterned dielectric layer 210. The first reflective electrode 212 ohmically contacts to the first surface 202a of the light-emitting surface 202, and the second electrode structure 216 ohmically contact to the second surface 202b of the light-emitting stack 202, and contact areas of the second electrode structure 216 and the first reflective electrode 212 do not overlap with each other in a vertical direction. A cross-sectional width of the barrier layer 222 can be slightly wider than the light-emitting stack 202, and the outer edge of the second portion 210b of the patterned dielectric layer 210 can approximately align with a side wall of the barrier layer 222 and project from a side wall of the light-emitting stack 202. A passivation layer 214 can cover a part of the second surface 202b of the light-emitting stack 202 that is not covered by the second electrode structure 216 by conforming to the shape of the light-emitting stack 202 and further cover a side wall of the light-emitting stack 202. The bottom of the passivation layer 214 contacts with the second portion 210b of the patterned dielectric layer 210. The material of the patterned dielectric layer 210 can comprise insulative oxide such as $TiO_2$ or $SiO_2$, insulative nitride such as $SiN_x$ or AlN, or other insulative material like $MgF_2$. The passivation layer 214 can comprise a first passivation layer 214a attaching to the second portion 210b of the patterned dielectric layer 210 and covering at least side wall of the light-emitting stack 202, and a second passivation layer 214b covering the first passivation layer 214a and the second surface 202b. The first passivation layer 214a comprises $Si_3N_4$ or $SiN_x$, and the second passivation layer 214b comprises $SiO_2$. In the embodiment, the first reflective electrode 212 and the patterned dielectric layer 210 is separated by a gap. The barrier layer 222 can comprise a first barrier layer 218 and a second barrier layer 220. A connection layer 224 can be formed between the barrier layer 222 and the permanent substrate 226.

Figure 3A:
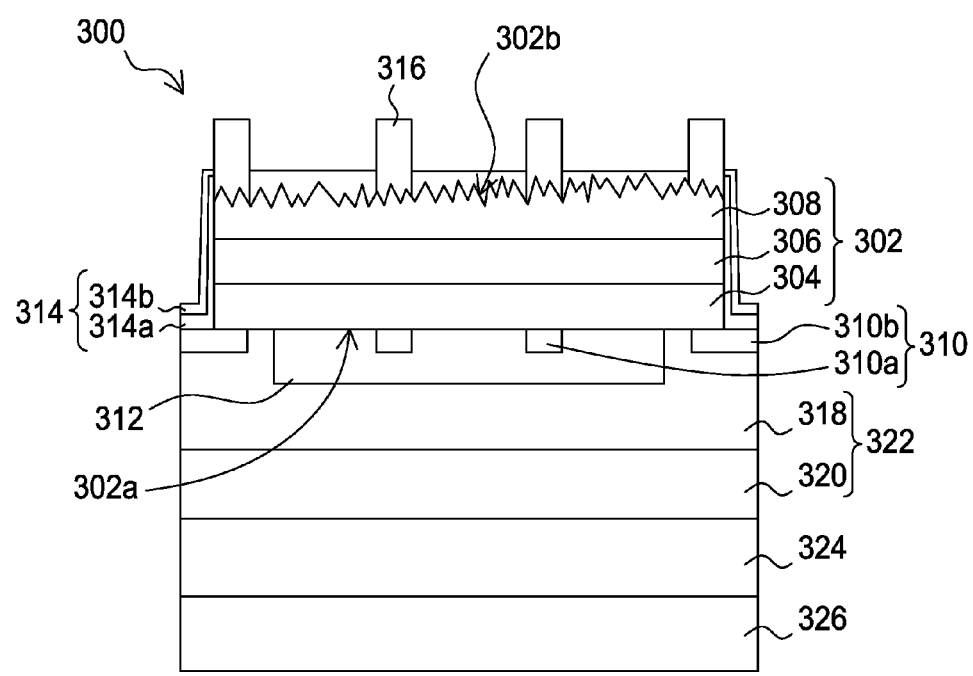
FIGS. 3A and 3B illustrate a light-emitting device in accordance with a third embodiment of the present application.

FIG. 3 illustrates a light-emitting device in accordance with a third embodiment of the present application. A light-emitting device 300 comprises: a permanent substrate 326; a lighting stack 302 formed on the permanent substrate 326 and comprising a first surface 302a toward the permanent substrate 326 and a second surface 302b opposite to the first surface 302a; a patterned dielectric layer 310 formed on the first surface 302a and comprising a first portion 310a and a second portion 310b approximately surrounding the first surface 302a, wherein the first portion 310a comprises a first thickness and the second portion 310b comprises a second thickness the same as the first thickness; a first reflective electrode 312 having reflectivity and covering the first portion 310a of the patterned dielectric layer 310, wherein the material of the first reflective electrode 312 can comprise Ag, Al or other metal having high reflectivity, or the sequence or alloy of aforesaid metal; and a barrier layer 322 covering the first reflective electrode 312 and the second portion 310b of the patterned dielectric layer 310. The second surface 302b of the light-emitting stack 302 can comprise a second electrode structure 316 comprising a pattern corresponding to that of the first portion 310a of the patterned dielectric layer 310. The first reflective electrode 312 ohmically contacts to the first surface 302a of the light-emitting surface 302, and the second electrode structure 316 ohmically contact to the second surface 302b of the light-emitting stack 302, and contact areas of the second electrode structure 316 and the first reflective electrode 312 do not overlap with each other in a vertical direction. A cross-sectional width of the barrier layer 322 can be slightly wider than the light-emitting stack 302, and the outer edge of the second portion 310b of the patterned dielectric layer 310 can approximately align with a side wall of the barrier layer 322 and project from a side wall of the light-emitting stack 302. A passivation layer 314 can cover a part of the second electrode structure 316 of the second surface 302b of the light-emitting stack 302 that is not covered by the second electrode structure 316 by conforming to the shape of the light-emitting stack 302 and further cover a side wall of the light-emitting stack 302. The bottom of the passivation layer 314 contacts with the second portion 310b of the patterned dielectric layer 310. The material of the patterned dielectric layer 310 can comprise insulative oxide such as $TiO_2$ or $SiO_2$, insulative nitride such as $SiN_x$ or MN, or other insulative material like $MgF_2$. The passivation layer 314 can comprise a first passivation layer 314a attaching to the second portion 310b of the patterned dielectric layer 310 and covering at least side wall of the light-emitting stack 302, and a second passivation layer 314b covering the first passivation layer 314a and the second surface 302b. The first passivation layer 314a comprises $Si_3N_4$ or $SiN_x$, and the second passivation layer 314b comprises $SiO_2$. In the embodiment, the first reflective electrode 312 and the patterned dielectric layer 310 is separated by a gap. The barrier layer 322 can comprise a first barrier layer 318 and a second barrier layer 320. A connection layer 324 can be formed the barrier layer 322 and the permanent substrate 326.

Figure 3B:
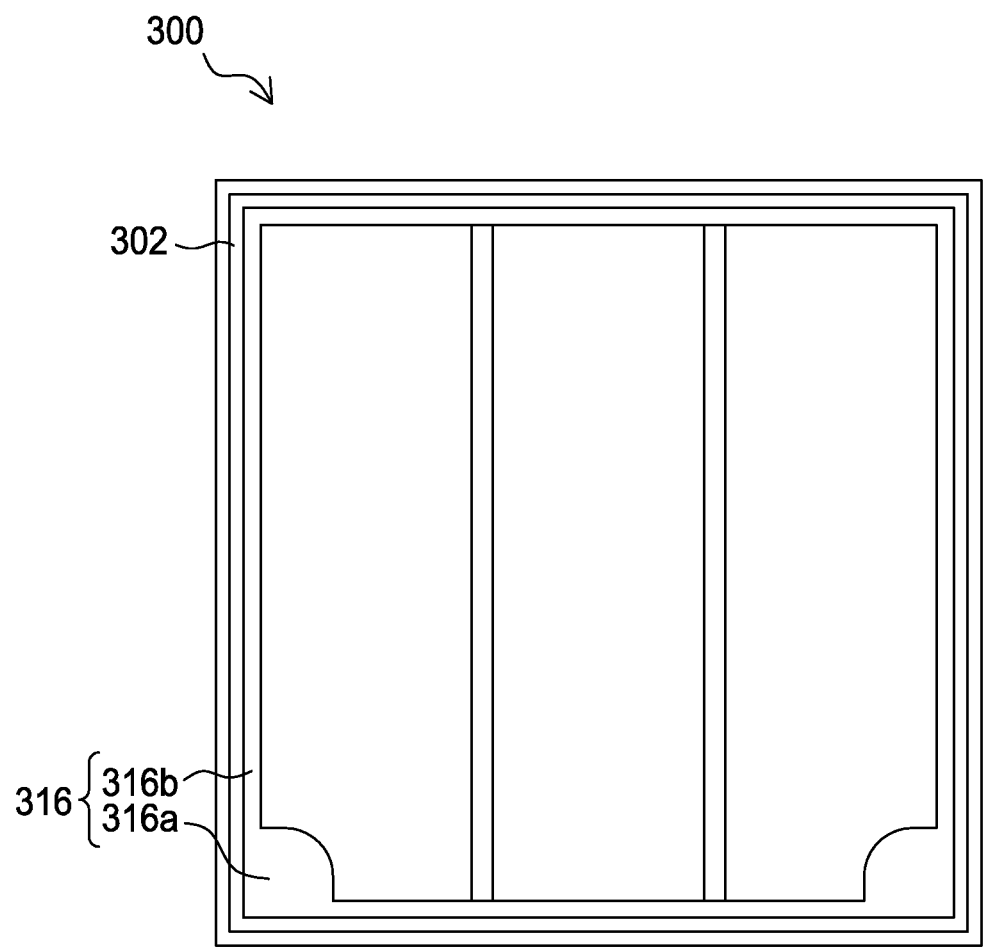

As shown in FIG. 3B, the second electrode structure 316 can comprise at least an electrode pad 316a and an extensive-branch like electrode 316b, the second portion 310b of the patterned dielectric layer 310 overlaps the electrode pad 316a and the extension-branch like electrode 316b from a top view. The second portion 310b of the patterned dielectric layer 310 can comprise a boundary surrounding the light-emitting stack 302, and the second portion 310b comprises a width wider than that of the extensive-branch like electrode 316b, and the section overlapping the electrode pad 316a of the second portion 310b corresponds to the pattern of the electrode pad 316a.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a light-emitting stack comprising a first surface, a roughened surface, and a side wall connecting the first surface and the roughened surface;
an electrode structure formed on the roughened surface of the light-emitting stack;
a patterned dielectric layer formed on the first surface of the light-emitting stack, comprising a first portion and a second portion substantially surrounding the first portion, the first portion comprising a first thickness, and the second portion comprising a second thickness substantially the same as the first thickness;
a first reflective electrode covering the first portion of the patterned dielectric layer and directly contacting the first surface of the light-emitting stack;
a barrier layer covering the first reflective electrode and the second portion of the patterned dielectric layer; and
a passivation layer covering the second portion of the patterned dielectric layer, the sidewall of the light-emitting stack, and the roughened surface of the light-emitting stack which is not occupied by the electrode structure, wherein the electrode structure is surrounded by the passivation layer, the passivation layer contacts an edge of the electrode structure and terminates at the edge of the electrode structure, and an interface between the electrode structure and the roughened surface of the light-emitting stack is devoid of the passivation layer.

2. The light-emitting device of claim 1, wherein the first portion of the patterned dielectric layer comprises the same material with that of the second portion.

3. The light-emitting device of claim 1, wherein the second portion of the patterned dielectric layer is projected from the side wall of the light-emitting stack and is connected to the first passivation layer.

4. The light-emitting device of claim 1, wherein the second portion of the patterned dielectric layer is between the barrier layer and the passivation layer.

5. The light-emitting device of claim 1, wherein the electrode structure comprises a first pattern corresponding to that of the first portion of the patterned dielectric layer.

6. The light-emitting device of claim 5, wherein the electrode structure comprises an electrode pad and an extensive-branch like electrode connected to the electrode pad, and the second portion of the patterned dielectric layer overlaps the electrode pad and the extensive-branch like electrode.

7. The light-emitting device of claim 6, wherein the second portion comprises a width wider than that of the extensive-branch like electrode at which overlapping the extensive-branch like electrode.

8. The light-emitting device of claim 6, wherein the area of the second portion of the patterned dielectric layer overlapping the electrode pad corresponds to a pattern of the electrode pad.

9. The light-emitting device of claim 5, wherein contact areas of the electrode structure contacting with the light-emitting stack and contact areas of the first reflective electrode contacting with the light-emitting stack do not overlap with each other in a vertical direction.

10. The light-emitting device of claim 1, wherein the passivation layer comprises a first passivation layer and a second passivation layer covering the first passivation layer and the roughened surface of the light-emitting stack, wherein the first passivation layer comprises different material from that of the second passivation layer.

11. The light-emitting device of claim 10, wherein the first passivation layer comprises $SiN_x$, and the second passivation layer comprises $SiO_2$.

12. The light-emitting device of claim 10, wherein the patterned dielectric layer comprises $SiO_2$ or $Al_2O_3$, and the first passivation layer comprises $SiN_x$.

13. The light-emitting device of claim 1, wherein the barrier layer does not contact the first surface of the light-emitting stack.

14. The light-emitting device of claim 1, wherein the first reflective electrode is devoid of covering the second portion of the patterned dielectric layer, and the first reflective electrode and the second portion of the patterned dielectric layer are separated by a gap.

15. The light-emitting device of claim 1, wherein the light-emitting stack comprises a p-type semiconductor layer on which the first surface is formed, an active layer formed on the p-type semiconductor layer, and an n-type semiconductor layer formed on the active layer.

16. The light-emitting device of claim 1, wherein all of the interface between the electrode structure and the roughened surface of the light-emitting stack is devoid of the passivation layer.

17. The light-emitting device of claim 16, further comprising a connection layer and a permanent substrate, wherein the connection layer is between the barrier layer and the permanent substrate.

18. The light-emitting device of claim 1, wherein the first reflective electrode comprises Ag.

19. A light-emitting device, comprising:
a light-emitting stack comprising a first surface, a second surface, and a side wall connecting the first surface and the second surface;
an electrode structure comprising an electrode pad and a plurality of extension electrodes formed on the second surface of the light-emitting stack;
a patterned dielectric layer formed on the first surface of the light-emitting stack, comprising a first portion and a second portion substantially surrounding the first portion;
a first reflective electrode covering the first portion of the patterned dielectric layer and directly contacting the first surface of the light-emitting stack; and
a passivation layer comprising a first passivation layer and a second passivation layer, wherein the first passivation layer contacts the second portion of the patterned dielectric layer, the sidewall of the light-emitting stack, and the second surface of the light-emitting stack, the second passivation layer covers the first passivation and formed between the plurality of extension electrodes, wherein the second passivation layer contacts a sidewall of the plurality of extension electrodes.

20. A light-emitting device, comprising:
a light-emitting stack comprising a first surface, a second surface, and a side wall connecting the first surface and the second surface;
an electrode structure comprising an electrode pad and a plurality of extension electrodes formed on the second surface of the light-emitting stack;
a patterned dielectric layer formed on the first surface of the light-emitting stack, comprising a first portion and a second portion substantially surrounding the first portion;
a first reflective electrode covering the first portion of the patterned dielectric layer and directly contacting the first surface of the light-emitting stack; and
a passivation layer contacting the second portion of the patterned dielectric layer, the sidewall of the light-emitting stack and the second surface of the light-emitting stack, and formed between the plurality of extension electrodes, wherein the passivation layer contacts a sidewall of the plurality of extension electrodes.

* * * * *